(12) United States Patent
Kuo et al.

(10) Patent No.: US 9,140,755 B2
(45) Date of Patent: Sep. 22, 2015

(54) TESTING APPARATUS WITH BACKDRIVING PROTECTION FUNCTION

(71) Applicant: Test Research, Inc., Taipei (TW)

(72) Inventors: Po-Shen Kuo, Taipei (TW); Hsin-Hao Chen, Taipei (TW)

(73) Assignee: Test Research, Inc., Taipei (TW)

( * ) Notice: Subject to any disclaimer, the term of this patent is extended or adjusted under 35 U.S.C. 154(b) by 167 days.

(21) Appl. No.: 13/897,287

(22) Filed: May 17, 2013

(65) Prior Publication Data

US 2014/0247530 A1  Sep. 4, 2014

(51) Int. Cl.
*H02H 3/08* (2006.01)
*H02H 9/02* (2006.01)
*G01R 31/319* (2006.01)
*H02H 3/087* (2006.01)

(52) U.S. Cl.
CPC ......... *G01R 31/31924* (2013.01); *H02H 3/087* (2013.01)

(58) Field of Classification Search
CPC ..... H02H 3/08; H02H 3/087; G01R 31/31924
USPC .......................... 361/93.1; 324/554, 537, 770
See application file for complete search history.

(56) References Cited

U.S. PATENT DOCUMENTS

| | | | |
|---|---|---|---|
| 4,862,069 A * | 8/1989 | Albee | 324/73.1 |
| 5,127,009 A | 6/1992 | Swanson | |
| 5,146,159 A | 9/1992 | Lau et al. | |
| 6,114,848 A | 9/2000 | Suto et al. | |
| 6,175,230 B1 * | 1/2001 | Hamblin et al. | 324/763.01 |
| 6,400,173 B1 * | 6/2002 | Shimizu et al. | 324/754.07 |
| 6,404,220 B1 * | 6/2002 | Hashimoto | 324/750.01 |
| 6,670,840 B1 | 12/2003 | Kiani et al. | |
| 6,906,553 B1 | 6/2005 | Wert | |
| 7,071,764 B1 | 7/2006 | Kiani | |
| 7,605,619 B1 | 10/2009 | Lu et al. | |
| 7,642,600 B1 | 1/2010 | Wert | |
| 2007/0176807 A1 * | 8/2007 | Mattes et al. | 341/118 |
| 2007/0234145 A1 * | 10/2007 | Baker et al. | 714/724 |
| 2008/0238340 A1 * | 10/2008 | Leung et al. | 315/297 |
| 2012/0253481 A1 * | 10/2012 | Alley et al. | 700/21 |

* cited by examiner

*Primary Examiner* — Thienvu Tran
*Assistant Examiner* — Lucy Thomas
(74) *Attorney, Agent, or Firm* — CKC & Partners Co., Ltd.

(57) ABSTRACT

A testing apparatus with a back-drive protection function is disclosed, where the testing apparatus includes a driver and a field programmable gate array (FPGA), where the driver is electrically connected to the FPGA. The FPGA can monitor output current from the driver and perform the back-drive protection function on the driver to protect device-under-test (DUT).

7 Claims, 2 Drawing Sheets

TESTING APPARATUS WITH BACKDRIVING PROTECTION FUNCTION

RELATED APPLICATIONS

This application claims priority to Taiwan Application Serial Number 102107302, filed Mar. 1, 2013, which is herein incorporated by reference.

BACKGROUND

1. Technical Field

The present disclosure relates to electronic equipment, and more particularly, a testing apparatus.

2. Description of Related Art

There are two conventional design schemes for back-drive protection: (1) analogue component-based scheme; and (2) integrated circuit (IC)-based scheme.

For the analogue component based scheme, analogue components such as resistors and capacitors are used to design the back-drive protection circuit and the pin driver. One problem associated with this scheme is the lack of stability and accuracy. With respect to the stability, a high level of current may result in over-heat of the circuit, thereby degrading the output quality. If the quality control is not carefully executed, this problem may damage the device under test. As to the accuracy of back-drive protection, the analogue component-based scheme could not be accurately control to accomplish the protection during a specified period. In the case where the errors of the component are high, the device under test may also be damaged.

On the other hand, the IC-based scheme is better over the analogue component-based scheme in terms of both the stability and accuracy. Under the IC-based schemes, the above-mentioned analogously disposed components are integrated into a chip to achieve the same functionality. In this way, the component exhibits a better heat-resistant and current control capability. However, the manufacturing cost for IC components is quite high.

In view of the foregoing, there exist problems and disadvantages in the current design schemes that wait further improvement. However, those skilled in the art sought vainly for a solution. Accordingly, there is an urgent need in the related field to provide a solution that balances the desire for a lower cost, stability and accuracy.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one or more various aspects, the present disclosure is directed to a testing apparatus with a back-drive protection function, so as to solve or circumvent aforesaid problems.

According to one embodiment of the present disclosure, a testing apparatus with a back-drive protection function includes at least one driver and a field programmable gate array (FPGA). The FPGA is electrically connected to the driver. The FPGA monitors output current from the driver and performs the back-drive protection function on the driver.

The driver includes an operational amplifier, a current amplifier, a current-sensing resistor and an analog to digital converter. The operational amplifier has an input terminal for receiving an input signal. The current amplifier is connected to an output terminal of the operational amplifier. The current-sensing resistor is connected to the current amplifier and an output, where the output is connected to a tested circuit and another terminal of the operational amplifier. The analog to digital converter is connected to two ends of the current-sensing resistor for sending an output result to the FPGA.

The FPGA includes a real-time current measuring unit. The real-time current measuring unit measures real-time current based on the output result.

The FPGA includes a driver self-checking unit. The driver self-checking unit checks whether the driver is normal according to the real-time current.

The FPGA includes a protection on-off unit. The protection on-off unit receives a compiler program to set whether enabling the back-drive protection function.

The FPGA includes a back-drive protection unit. The back-drive protection unit outputs a control signal to the driver according to a programmable back-drive current and a programmable back-drive time when the back-drive protection function is enabled.

The FPGA includes a pin status indicator. The pin status indicator recording information that the back-drive protection function is applied to the driver to protect the tested circuit when the back-drive protection function is enabled and further satisfies the programmable back-drive current and the programmable back-drive time set by the back-drive protection unit.

The driver includes a plurality of pin drivers.

Technical advantages are generally achieved, by embodiments of the present invention, as follows:

1. The FPGA is utilized to reduce the manufacturing cost;
 2. The development time is decreased; and
 3. All digital functions in FPGA, such as back-driver protection, can be maintained and modified as wanted. However IC-based method, once IC has been done and it's over. Digital functions cannot be changed at all.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
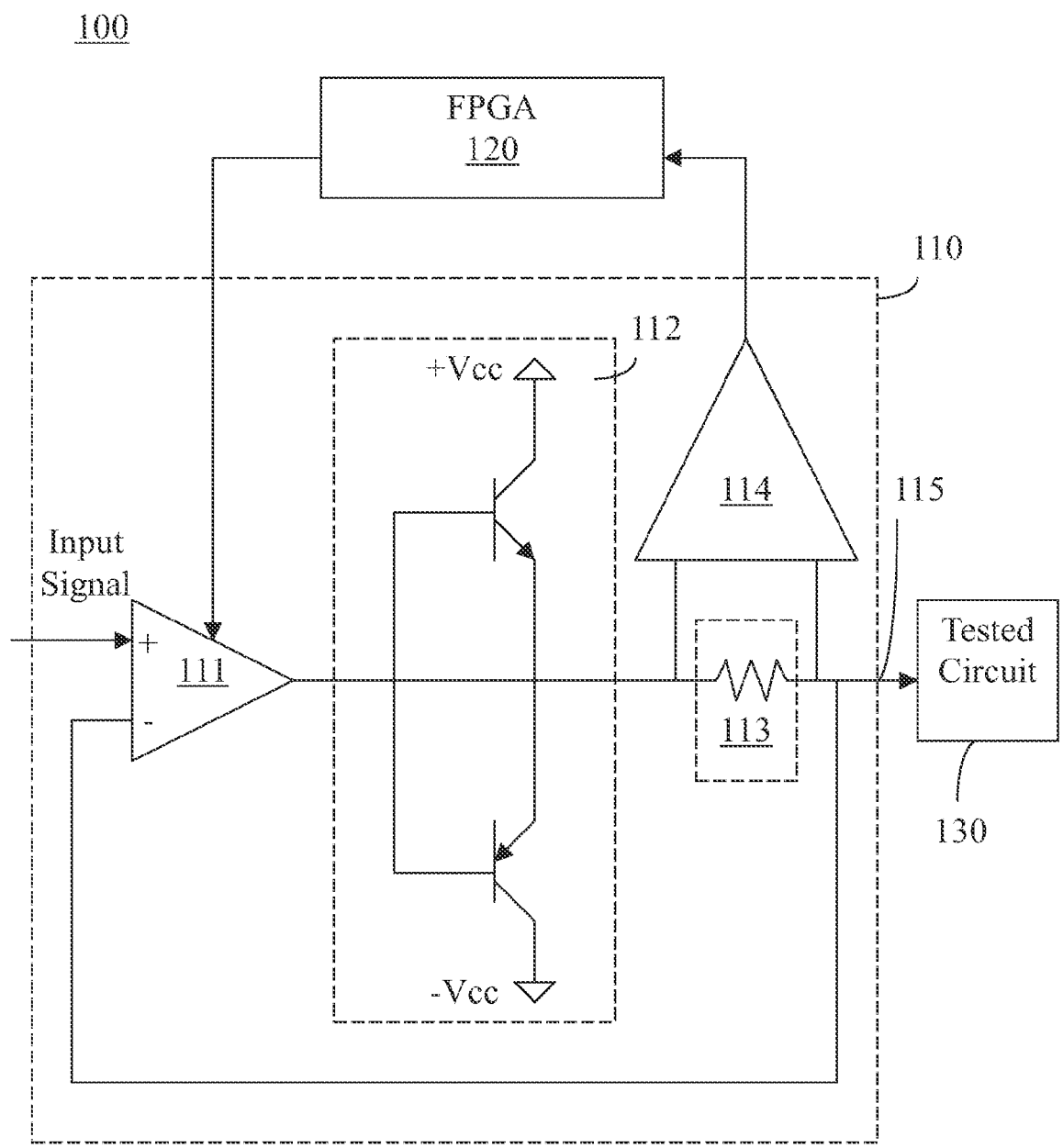
FIG. 1 is a local circuit diagram of a testing apparatus with a back-drive protection function according to one embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one aspect, the present invention is directed to a testing apparatus with a back-drive protection function. This testing apparatus may be easily applied to circuit test, and may be applicable or readily adaptable to all related technology. It should be noted that a field programmable gate array (FPGA) is configured in the testing apparatus to accomplish the back-drive protection function. For a more complete understanding of the testing apparatus, and the advantages thereof, please refer to FIGS. 1-2 and embodiments of the present disclosure.

FIG. 1 is a local circuit diagram of a testing apparatus 100 with a back-drive protection function according to one embodiment of the present disclosure. As shown in FIG. 1, the testing apparatus includes at least one driver 110 and a FPGA 120. The driver 110 is electrically connected to the FPGA 120, and a tested circuit 130 is electrically connected to the driver 110. The FPGA 120 monitors output current from the driver 110 and performs the back-drive protection function on the driver 110. In this way, the FPGA 120 is utilized to reduce the manufacturing cost and development time and facilitates maintainability and modification for the back-drive protection function. In conventional art, IC cannot be changed, and therefore the conventional art causes great inconvenience.

It should be noted that single one driver 110 shown in FIG. 1 for illustrative purposes only. Those with ordinary skill in the art may flexibly choose one or more drivers depending on the desired application. In practice, one FPGA 120 can be connected to a plurality of drivers, such as pin drivers. In use, the pin drivers are utilized to test the tested circuit.

In FIG. 1, the driver 110 includes an operational amplifier 111, a current amplifier 112, a current-sensing resistor 113 and an analog to digital converter 114, where the current amplifier 112 consists of transistor (e.g., MOS) and resistor. The operational amplifier 111 has an input terminal for receiving an input signal (i.e., an voltage level of the tested circuit 130). The current amplifier 112 is connected to an output terminal of the operational amplifier 111. The current-sensing resistor 113 is connected to the current amplifier 112 and an output 115, where the output 115 is connected to the tested circuit 130 and another terminal of the operational amplifier 111. The analog to digital converter 114 is connected to two ends of the current-sensing resistor 113 for sending an output result to the FPGA 120. Thus, the FPGA 120 can acquire a real-time status of the driver 110.

Figure 2:
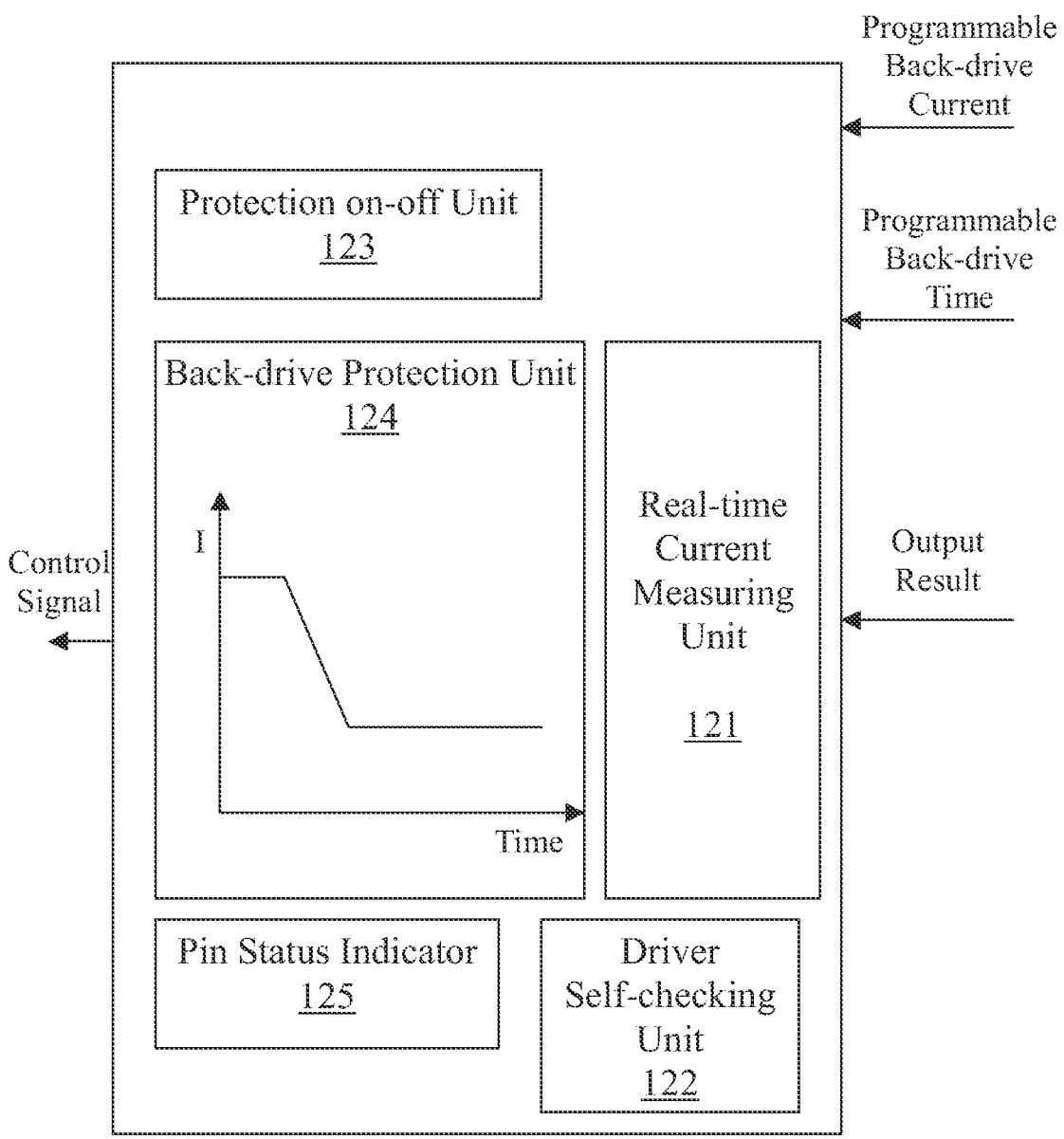
FIG. 2 is a block diagram of a field programmable gate array (FPGA) according to another embodiment of the present disclosure.

For a more complete understanding of the FPGA 120, and the advantages thereof, please refer to FIG. 2. FIG. 2 is a block diagram of the FPGA according to another embodiment of the present disclosure. As shown in FIG. 2, the FPGA 120 includes a real-time current measuring unit 121. In use, the real-time current measuring unit 121 receives the output result from the analog to digital converter 114 and measures real-time current based on the output result. Thus, the FPGA 120 can measure the real-time current of the driver 110.

In addition, the FPGA 120 includes a driver self-checking unit 122. In use, the driver self-checking unit 122 checks whether the driver 110 is normal according to the real-time current. Thus, the FPGA 120 can enhance the self-check function and further improve the quality of the test apparatus.

Moreover, the FPGA 120 includes a protection on-off unit 123, a back-drive protection unit 124 and a pin status indicator 125. The protection on-off unit 123 receives a compiler program to set whether enabling the back-drive protection function. In this way, those with ordinary skill in the art (e.g., a user, an operator, or a developer) may flexibly decide whether the back-drive protection function is enabled or disabled depending on the desired application.

When the back-drive protection function is enabled, the back-drive protection unit 124 outputs a control signal to the driver 110 according to a programmable back-drive current and a programmable back-drive time. In this way, the back-drive protection function is to limit back-drive "time" based on back-drive current that driver 110 gives while testing, and these two values are programmed in 124 prior to testing mission, in which this limit function is performed according to the programmable back-drive current and time, so as to achieve the capability of protecting the tested circuit. In contrast, when the back-drive protection function is disabled, the back-drive protection unit 124 doesn't perform above limit function When the back-drive protection function is enabled and further satisfies the programmable back-drive current and the programmable back-drive time set by the back-drive protection unit 124, the pin status indicator 125 records information that the back-drive protection function is applied to the driver 110 to protect the tested circuit 130. In practice, when the number of the driver 110 is plural, the pin status indicator 125 may indicate and the record one or more drivers that the back-drive protection is performed; furthermore, the pin status indicator 125 may also indicate and the record the other drivers that the back-drive protection isn't performed, so as to facilitate the user, the operator or the developer to monitor and debug.

In view of the foregoing, the present disclosure integrates the design schemes for both the analogue components and IC components by utilizing the respective advantages of these schemes so as to improve the functionality of the next-generation pin drivers. In terms of the capability of current-supply, the pin driver is designed according to the analogue component such as the transistor amplifier; whereas in terms of the protection of the back-drive current, the analogue circuit design of the analogue component-based scheme is replaced with the IC design that uses the FPGA of the present disclosure to achieve the accurate protection. Notably, the use of FPGA may greatly reduce the manufacturing cost and provide the flexibility in which the digitalized functionalities could be change on demand.

It should be noted that above values shown in Tables 1 and 2 for illustrative purposes only. Those with ordinary skill in the art may flexibly choose parameters depending on the desired application.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112(f). In particular, the use of "step of" in the claims herein is not intended to invoke the provisions of 35 U.S.C. §112(f).

What is claimed is:

1. A testing apparatus with a back-drive protection function, the testing apparatus comprising:
   at least one driver; and
   a field programmable gate array (FPGA) electrically connected to the driver for monitoring output current from the driver and performing the back-drive protection function on the driver,
   wherein the driver comprises:
      a current amplifier;
      a current-sensing resistor having one end being in direct contact with the current amplifier and another end being in direct contact with a tested circuit;
      an analog to digital converter connected to the one end and the another end of the current-sensing resistor for sending an output result to the FPGA; and
      an operational amplifier having one input terminal being in direct contact with the one end of the current-sensing resistor and another input terminal of receiving an input signal that is an voltage level of the tested circuit.

2. The testing apparatus of claim 1, wherein the FPGA comprises:
   a real-time current measuring unit for measuring real-time current based on the output result.

3. The testing apparatus of claim 2, wherein the FPGA further comprises:
   a driver self-checking unit for checking whether the driver is normal according to the real-time current.

4. The testing apparatus of claim 1, wherein the FPGA comprises:
   a protection on-off unit for receiving a compiler program to set whether enabling the back-drive protection function.

5. The testing apparatus of claim 4, wherein the FPGA further comprises:
   a back-drive protection unit for outputting a control signal to the driver according to a programmable back-drive current and a programmable back-drive time when the back-drive protection function is enabled.

6. The testing apparatus of claim 5, wherein the FPGA further comprises:
   a pin status indicator for recording information that the back-drive protection function is applied to the driver to protect the tested circuit when the back-drive protection function is enabled and further satisfies the programmable back-drive current and the programmable back-drive time set by the back-drive protection unit.

7. The testing apparatus of claim t, wherein the driver includes a plurality of pin drivers.

* * * * *